(12) United States Patent
Kim et al.

(10) Patent No.: US 6,316,151 B1
(45) Date of Patent: Nov. 13, 2001

(54) STENCIL MASK

(75) Inventors: Cheol Kyun Kim, Seoul; Ki Ho Baik, Kyoungki-do, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/442,983

(22) Filed: Nov. 18, 1999

(30) Foreign Application Priority Data

Dec. 18, 1998 (KR) .................................. 98-56058

(51) Int. Cl.[7] .................. G03F 9/00; A61N 5/00; G21G 5/00; G03C 5/00
(52) U.S. Cl. .................. 430/5; 430/296; 250/492.3
(58) Field of Search .................. 430/5, 296, 322; 378/35; 250/492.3

(56) References Cited

U.S. PATENT DOCUMENTS

| | | | |
|---|---|---|---|
| 4,661,203 | 4/1987 | Smith et al. | 156/643 |
| 5,523,185 | 6/1996 | Goto | 430/5 |
| 5,569,569 | 10/1996 | Goto et al. | 430/5 |
| 5,831,272 | 11/1998 | Utsumi | 250/492.2 |
| 5,858,576 | 1/1999 | Takashi et al. | 430/5 |
| 6,066,418 | * 5/2000 | Yoshihara | 430/5 |

FOREIGN PATENT DOCUMENTS

| | | |
|---|---|---|
| 7209856 | 8/1995 | (JP) . |
| 1070067 | 3/1998 | (JP) . |

\* cited by examiner

*Primary Examiner*—S. Rosasco
(74) *Attorney, Agent, or Firm*—Selitto, Behr & Kim

(57) ABSTRACT

A stencil mask used as an exposure mask in a non-optical lithography process using an electron beam, X-ray or ion beam as a light source, comprising: a membrane; and a layer formed over the membrane, for scattering or absorbing electrons, wherein the layer for scattering or absorbing has a multi-layered structure in which two or more layers comprised of different materials are stacked.

6 Claims, 4 Drawing Sheets

STENCIL MASK

BACKGROUND OF THE INVENTION

1. Field of the Invention

This invention relates to a photomicrography process using a non-optical exposure apparatus, and more particularly to a stencil mask using a mask for exposure in a lithography process using a non-optical exposure apparatus.

2. Description of the Related Art

Non-optical exposure apparatus using an electron beam, ion beam or X-ray or the like as a light source has a superior resolution compared to the conventional optical exposure apparatus using G-line or I-line as a light source. According to this, the lithography process using the non-optical exposure apparatus makes it possible to form fine patterns of below critical dimension which cannot be obtained by the prior lithography using the conventional optical exposure apparatus. The lithography process using the non-optical exposure apparatus is typically utilized in fabricating a mask for exposure as well as in fabricating non-memory devices such as a logic device or an ASICs.

A stencil mask as a mask for exposure is used in the lithography process using the non-optical exposure apparatus. The stencil mask is a general term for a mask used in the non-optical lithography using an ion beam, X-ray, or electron beam as a light source and includes a cell projection mask and a projection electron-beam lithography mask.

FIG. 1A is a sectional view of a cell projection mask in the prior art. A cell projection mask 10a includes a frame 1 for supporting means, a membrane 2a formed over the frame 1, for making a stress due to electron beam to maintain balance and an absorber 3a formed over the membrane 2a, for aborbing or scattering an electron beam. The cell projection mask 10a is fabricated by processing an SOI wafer where an oxide layer is sandwiched between silicon layers. The absorber 3a is made of a single material and the light absorbing in the absorber 3a is varied with the density and atomic weight of the material of the absorber. The absorber 3a is typically comprised of a silicon layer and the thickness of the silicon layer is determined in accordance with the acceleration voltage of electron. If the absorber is comprised of a silicon layer and the acceleration voltage of electron is 50 keV, it is known that the scattering depth of electron, that is the penetration depth of electron being scattering in the silicon layer, is 12 µm. Accordingly, the thickness of the silicon layer for the absorber should be maintained at 20 µm thicker than the penetration depth of 12 µm so as to prevent the electron beam from penetrating the silicon layer for the absorber.

FIG. 1B is a sectional view of a projection electron-beam lithography mask in the prior art. A projection electron beam lithography mask 10b includes a membrane 2b and a scatterer 3b. The scatterer 3b is comprised of a single material, for example a silicon layer, like the absorber in the cell projection mask. The scattering angle of the electrons in the scatterer 3b is determined in accordance with the original characteristic of the material for the scatterer 3b.

However, the cell projection mask and the projection electron beam lithography mask have disadvantages as follows. FIG. 2A and FIG. 2B are diagrams illustrating phenomenon generated in the silicon layers for the absorber and the scatterer, respectively, in case where the silicon layers for the absorber and the scatterer have the respective thickness of 20 µm and 10 µm and the acceleration voltage of the electrons incident to the silicon layers is 50 keV. The reference numeral 20a designates the silicon layer having a thickness of 20 µm, 20b designates the silicon layer having a thickness of 10 µm, 30a designates incident electrons, 30b designates the electrons reflected from the surface of the silicon layer, 30c designates the electrons scattered or absorbed in the silicon layer, 30d designates the electrons which are scattered to the side wall of the silicon layer to cause the interference with the electrons penetrated through apertures, and 30e designates the electrons penetrating the silicon layer, respectively.

Referring to FIG. 2A, in case where the thickness of the silicon layer is 20 µm, if the electrons 30a are incident to the silicon layer 20a, the electrons of about 15% of the incident electrons 30a are reflected from the surface of the silicon layer 20a and the electrons 30c of the remaining 85% are scattered in the silicon layer 20a. Most electrons 30c scattered in the silicon layer 20a are absorbed in the silicon layer 20a. However, a portion of the electrons, that is the electrons 30d scattered to the side wall of the silicon layer 20a, is not absorbed in the silicon layer 20a and has an effect on the electrons which are actually participated in patterning. As a result, the contrast of the electron beam due to the interference becomes degraded and it cannot obtain the desired pattern having a vertical etching profile. Furthermore, in case where the thickness of the silicon layer is 20 µm, it takes a long time to etch the silicon layer so that the time required in processing is increased and the stability of the exposure process is not assured. Accordingly, considering the process aspect, it should reduce the thickness of the silicon layer. However, if the silicon layer becomes thin, the amount of electrons penetrating the silicon layer for the absorber is increased, thereby degrading remarkably the resolution of the mask.

Referring to FIG. 2B, in case where the acceleration voltage of electrons is 50 KeV and the thickness of the silicon layer is thinner than the penetration depth of electrons, the electrons of 15% of the incident electrons 30a in the silicon layer 20b are reflected from the surface of the silicon layer 20b and the electrons of the remaining 85% are penetrated into the silicon layer 20b. Of the electrons of 85%, a portion of about 36% is completely absorbed in the silicon layer 20b and the remaining portion of about 49% penetrates the silicon layer 20b. Therefore, when the thickness of the silicon layer 20b is thinner than the penetration depth of the electrons, that is when the penetration depth of the electrons is 12 µm and the thickness of the silicon layer 20b is 10 µm, the amount of the electrons penetrating the silicon layer 20b is increased and hence make it difficult to obtain the desired pattern. Besides, because the electrons 30d scattered to the side wall of the silicon layer 20b cause the interface with the electrons which are actually participated in patterning, the form of electron beam penetrating the apertures is changed and it cannot obtain the desired pattern having a vertical etching profile.

On the other hand, the electrons penetrating through the absorber or the scatterer of the silicon layer transform the form of the electron beam made by the stencil mask and degrade the resolution and the contrast of the mask. So as to solve this, as shown in FIG. 1B, in the prior lithography system, an angular limiting aperture 15 for limiting the scattering angle is disposed below the projection electron beam lithography mask 10b. The angular limiting aperture 15 as shown in FIG. 3 includes a transmitting portion 15a which is disposed in the central portion thereof and a shielding portion 15b. The angular limiting aperture 15 shields the electrons scattered at a large angle through the shielding portion 15b to make the desired pattern to be obtained.

However, the electrons scattered at a small angle are transmitted through the transmitting portion 15a as usual and they have an effect on the pattern and make it difficult to obtain the desired pattern.

SUMMARY OF THE INVENTION

It is an object of the present invention to provide a stencil mask being capable of accomplishing ease in a process and the improved resolution with reduction in thickness of a silicon layer for an absorber or scatterer.

There is provided a stencil mask used as an exposure mask in a non-optical lithography process using an electron beam, X-ray or ion beam as a light source, comprising: a membrane; and a layer formed over the membrane, for absorbing or scattering electrons, wherein the layer for absorbing or scattering has a multi-layered structure in which two or more layers comprised of different materials are stacked.

There is also provided a stencil mask, comprising: a frame for supporting means; a membrane formed over the frame, for making a stress due to an electron beam to maintain balance; and an absorber formed over the membrane, for absorbing or scattering the electron beam, wherein the absorber has a multi-layered structure in which two or more layers comprised of different materials are stacked.

There is still provided a stencil mask, comprising: a membrane; and a scatterer formed over the membrane, for scattering electrons penetrating the membrane, wherein the scatterer has a multi-layered structure in which two or more layers comprised of different materials are stacked.

In the stencil mask, the absorber or the scatterer is selected from a silicon layer, polysilicon layer, SiC layer, GaAs layer, W layer, $WSi_x$ layer, Al layer, Ta layer, TiN layer, Pt layer, Pb layer or $Si_3N_4$ layer.

BRIEF DESCRIPTION OF DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1A:
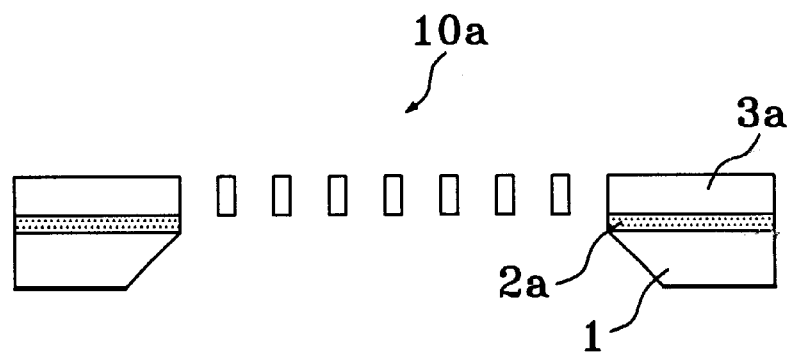
FIG. 1A is a sectional view of a stencil mask in the prior art.
Figure 1B:
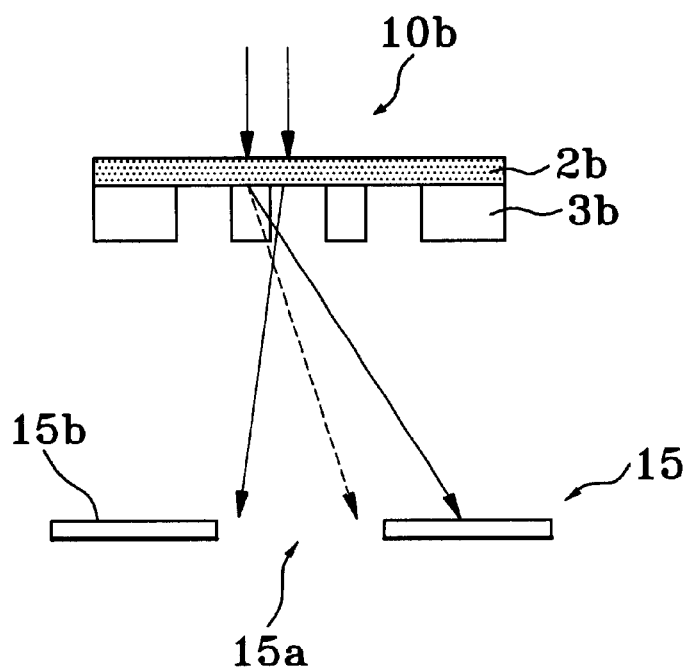
FIG. 1B is a sectional view of a projection electron-beam lithography mask in the prior art.
Figure 2A:
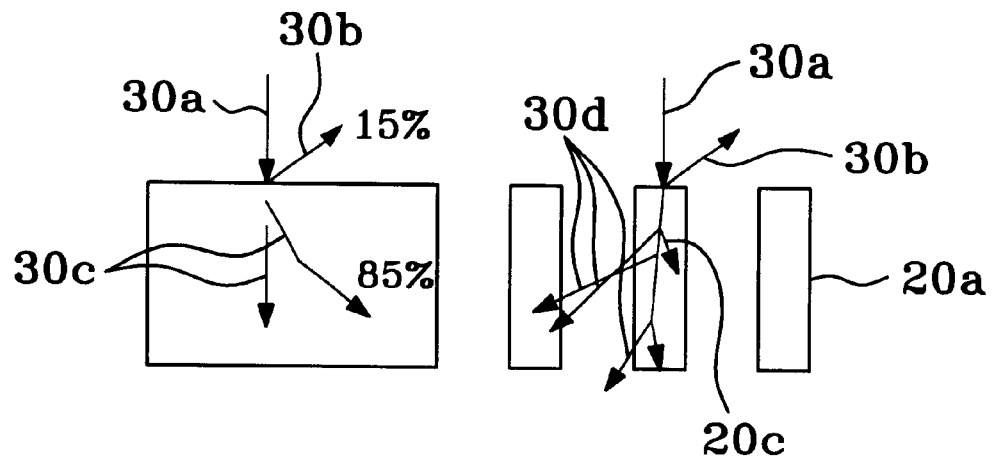
FIG. 2A and FIG. 2B are sectional views illustrating the incidence, reflection, scattering and absorption of electrons in accordance with a thickness of a silicon layer in the prior art.
Figure 2B:
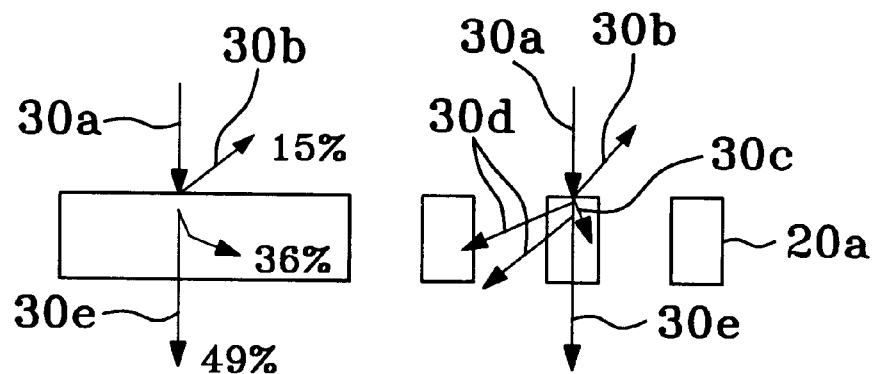
Figure 3:
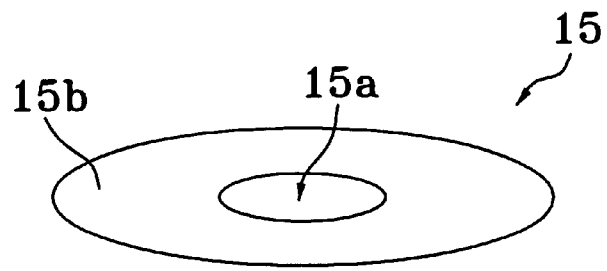
FIG. 3 is a perspective view of an angular limiting aperture of the projection electron-beam lithography mask in FIG. 1B.
Figure 4:
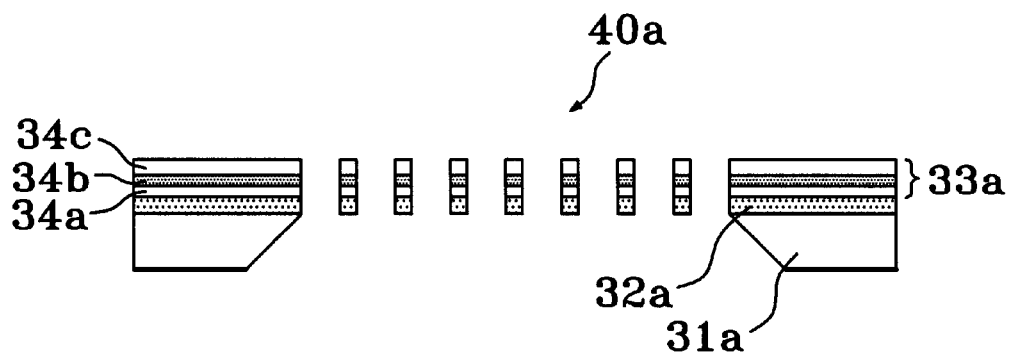
FIG. 4 is a sectional view of a cell projection mask in accordance with an embodiment of the present invention.

FIG. 4 shows a sectional view of a cell projection mask in accordance with an embodiment of the present invention.

A cell projection mask 40a includes a frame 31a for supporting means, a membrane 32a formed over the frame 31a, for making a stress due to an electron beam to maintain balance and an absorber 33a formed over the membrane 32a, for absorbing or scattering the electron beam. The absorber 33a is comprised of two or more layers 34a, 34b and 34c which are selected from a silicon layer, polysilicon layer, SiC layer, GaAs layer, W layer, $WSi_x$ layer, Al layer, Ta layer, TiN layer, Pt layer, Pb layer or $Si_3N_4$ layer. Because the absorber 33a has a stack structure, that is at least two or more different material layers 34a, 34b and 34c, the thickness of the absorber 33a is reduced compared to the silicon layer of the prior mask.

Figure 5:
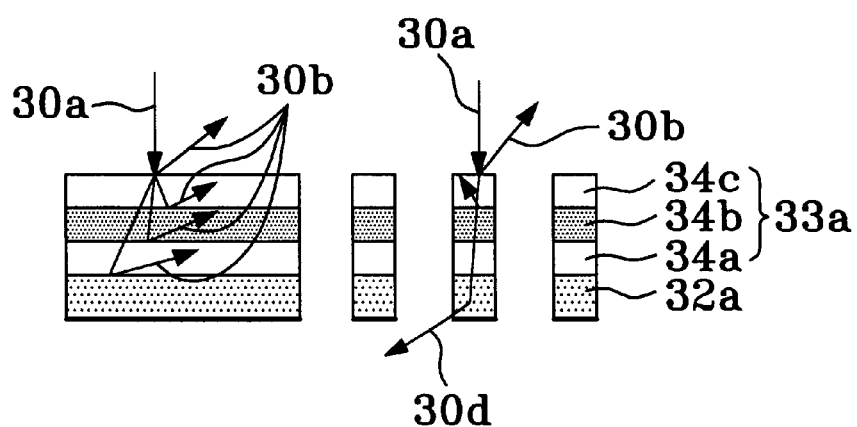
FIG. 5 is a sectional view illustrating the incidence, reflection, scattering and absorption of electrons in an absorber of the cell projection mask in FIG. 4.

Distinctly speaking, the amount of the electrons reflected from a surface of the absorber to the electrons incident to the absorber is inversely proportional to the acceleration voltage of the electrons incident to the absorber and varied with the density and atomic weight of the material for the absorber. Referring to FIG. 5, suppose that the electrons 30a incident to the absorber 33a being comprised of multilayers made of materials different from each other, reflect in the interfaces between layers 34a, 34b and 34c, respectively. Accordingly, the amount of the electrons 30b reflected from the absorber 33a is increased. At this time, the more the incident electrons 30a meet with the interface between the layers 34a, 34b and 34c, the more the amount of the reflected electrons is largely increased.

Therefore, when the thickness of the silicon layer for the absorber is thinner than the penetration depth of the electrons, the amount of the electrons penetrating the silicon layer is increased. However, because most electrons incident to the absorber of a stack structure being comprised of different materials are reflected in the interface within the layers, it can reduce the thickness of the absorber.

The electrons in the multi-layer absorber are scattered with a specific angle. In particular, of the scattered electrons, the electrons 30d penetrating the side wall of the absorber has a critical scattering angle. At this time, the critical scattering angle is dependent on the acceleration of electrons, the thickness and the mean free path of the material for the absorber. In case where the silicon layer is used for the absorber, when the acceleration voltage of electrons is set at 50 keV and the silicon layer has a thickness of 1 $\mu$m, 10 $\mu$m and 20 $\mu$m, respectively, it is known that the critical scattering angle of the electrons scattering to the side wall of the silicon layer is 150 mrad, 750 mrad and 950 mrad, respectively, to the respective thickness of the silicon layer.

However, when the silicon layer of 1 $\mu$m is stacked in ten layers, the critical scattering angle is not similar to 750 mrad which is the critical scattering angle in the silicon layer of 10 $\mu$m. Actually, the electrons incident to the absorber where the silicon layer of 1 $\mu$m is stacked in ten layers or more, are scattering with the critical scattering angle of 150 mrad and they are continuously scattering with the critical scattering angle of 150 mrad while passing through the silicon layers of 1 $\mu$m. Accordingly, the critical scattering angle penetrating the absorber of ten silicon layers becomes 1500 mrad which is ten times as large as the critical scattering angle in a single silicon layer of 1 $\mu$m.

As a result, when the materials having the same critical scattering angle are stacked, the amount of the reflected electrons and the scattering angle are increased so that it can reduce the thickness of the silicon layer for the absorber and it can overcome difficulty in a process.

Figure 6:
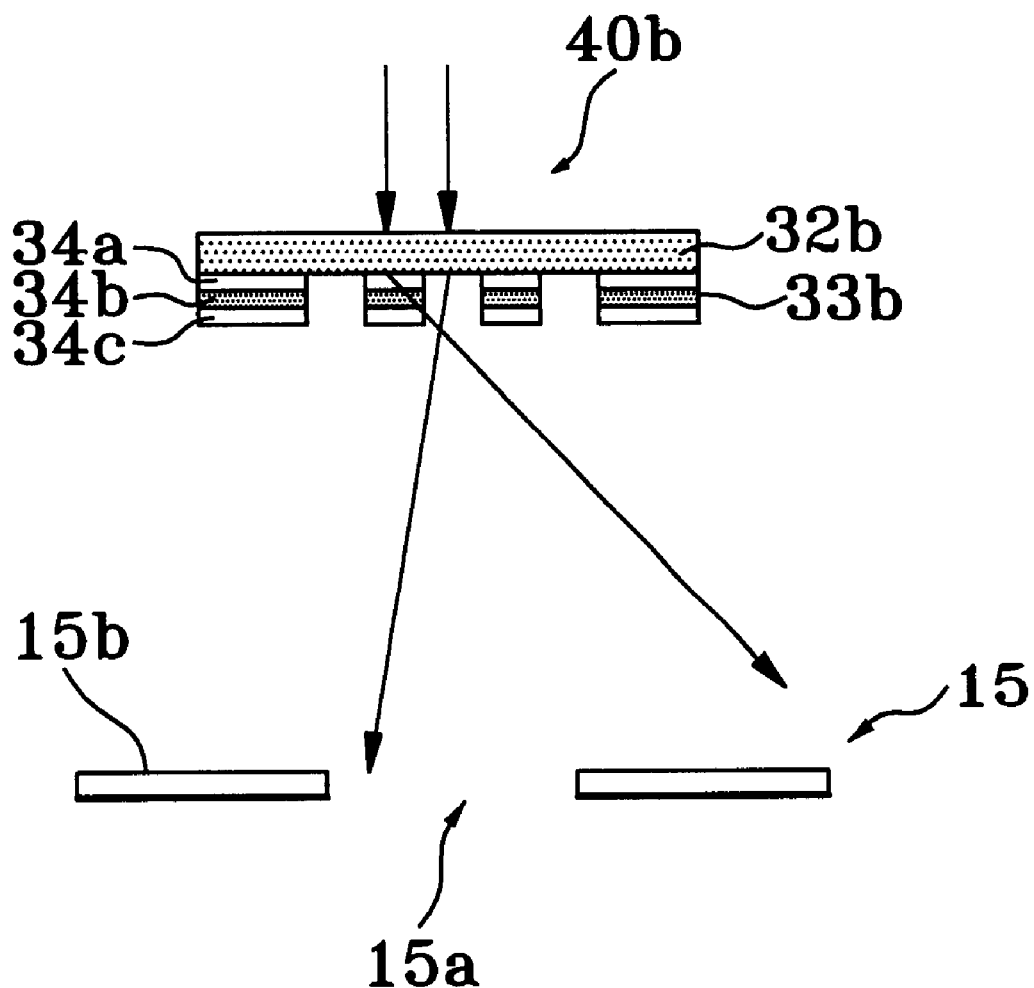
FIG. 6 is a sectional view of a projection electron-beam lithography mask in accordance with another embodiment of the present invention.

FIG. 6 shows a sectional view of a projection electron beam lithography mask in accordance with another embodiment of the present invention. A projection electron beam lithography mask 40b includes a membrane 32b being comprised of an oxide layer and a scatterer 33b formed over the membrane 32b, for making the electrons penetrating the membrane 32b to be scattered at a selected angle. The scatterer 33b is comprised of two or more layers 34a, 34b and 34c like the absorber 32a in FIG. 4. The layers 34a, 34b and 34c of the scatterer 32b are selected from a silicon layer, polysilicon layer, SiC layer, GaAs layer, W layer, $WSi_x$ layer, Al layer, Ta layer, TiN layer, Pt layer, Pb layer or $Si_3N_4$ layer. If the electron beam is incident to the scatterer 33b being comprised of different material layers 34a, 34b and 34c, the electrons are scattered at a larger angle compared to a prior mask. Accordingly, when an angular limiting aperture 15 including a transmitting portion 15a and a shielding portion 15b is disposed below the projection electron beam lithography mask 40b, although the electrons penetrate the scatterer 33b, they are scattered at the first critical scattering angle at the first interface between layers 34a and 34b and then are scattered at the second critical scattering angle at the second interface between the layers 34b and 34c again, when the electrons pass the scatterer 33b being comprised of multi-layers 34a, 34b and 34c having different materials, so that the electrons scattered to the side wall of the scatterer 33b are shielded by the shielding portion 15b of the angular limiting aperture 15. As a result, the electrons scattered by the scatterer 33b do not penetrate the angular limiting aperture 15 and the contrast and resolution can be improved. The angular limiting aperture 15 is applicable to the cell projection mask.

According to the present invention, the absorber or the scatterer is formed by stacking two or more layers being comprised of different materials, so that it can reduce the thickness of the absorber or the scatterer and the processing time for etching the absorber or scatterer and it can obtain the desired patterns. Furthermore, because the absorber or the scatterer has multi-layers, the scattering angle of the electrons is increased and the electrons penetrating the absorber or the scatterer have no effect on the electrons actually participating in patterning, thereby improving the resolution and the contrast.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A stencil mask used as an exposure mask in a non-optical lithography process using an electron beam, X-ray or ion beam as a light source, comprising:

a membrane; and a layer formed over the membrane for scattering or absorbing electrons, wherein the layer has a multi-layered structure having at least two layers, each of said at least two layers being made from a material different from the material of the other layer so as to form an interface between said at least two layers for reflecting at least a portion of electrons penetrating through the layer, whereby the thickness of the layer can be minimized.

2. The stencil mask as claimed in claim 1, wherein each of said at least two layers is made from a material selected from silicon, polysilicon, SiC, GaAs, W, $WSi_x$, Al, Ta, TiN, Pt, Pb or $Si_3N_4$.

3. A stencil mask comprising:

a frame for supporting means;

a membrane formed over the frame; and an absorber formed over the membrane for absorbing or scattering an electron beam, wherein the absorber has a multi-layered structure having at least two layers, each of the layers being made from a material different from the material of the other layer so as to form an interface between the layers for reflecting at least a portion of an electron beam penetrating through the absorber, whereby the thickness of the absorber can be minimized.

4. The stencil mask as claimed in claim 3, wherein each of the layers is made from a material selected from silicon, polysilicon, SiC, GaAs, W, $WSi_x$, Al, Ta, TiN, Pt, Pb or $Si_3N_4$.

5. A stencil mask comprising:

a membrane; and a scatterer formed over the membrane for scattering electrons penetrating the membrane, wherein the scatterer has a multi-layered structure having at least two layers, each of the layers being made from a material different from the material of the other layer so as to form an interface between the layers for reflecting at least a portion of electrons penetrating the scatterer, whereby the thickness of the scatterer can be minimized.

6. The stencil mask as claimed in claim 5, wherein each of the layers is made from a material selected from silicon, polysilicon, SiC, GaAs, W, $WSi_x$, Al, Ta, TiN, Pt, Pb or $Si_3N_4$.

* * * * *